(12) United States Patent
Gilbert et al.

(10) Patent No.: US 7,870,964 B2
(45) Date of Patent: Jan. 18, 2011

(54) IMPLEMENTATION OF MICROFLUIDIC COMPONENTS IN A MICROFLUIDIC SYSTEM

(75) Inventors: John R. Gilbert, Brookline, MA (US); Manish Deshpande, Canton, MA (US)

(73) Assignee: Cytonome / St, LLC, Boston, MA (US)

( * ) Notice: Subject to any disclaimer, the term of this patent is extended or adjusted under 35 U.S.C. 154(b) by 229 days.

(21) Appl. No.: 12/276,930

(22) Filed: Nov. 24, 2008

(65) Prior Publication Data

US 2009/0071541 A1 Mar. 19, 2009

Related U.S. Application Data

(60) Division of application No. 10/951,473, filed on Sep. 27, 2004, now Pat. No. 7,455,770, and a continuation-in-part of application No. 10/329,018, filed on Dec. 23, 2002, now Pat. No. 6,878,271.

(60) Provisional application No. 60/506,305, filed on Sep. 25, 2003, provisional application No. 60/409,489, filed on Sep. 9, 2002, provisional application No. 60/410,685, filed on Sep. 13, 2002.

(51) Int. Cl.
*A61M 1/00* (2006.01)
*G01N 1/02* (2006.01)
*B01D 63/08* (2006.01)
*B01D 63/00* (2006.01)

(52) U.S. Cl. .................. 210/417; 417/437; 422/101; 422/103; 210/418; 210/321.6; 210/632; 210/635; 210/90

(58) Field of Classification Search .................. None
See application file for complete search history.

(56) References Cited

U.S. PATENT DOCUMENTS

2005/0047967 A1* 3/2005 Chuang et al. .............. 422/100
2005/0158845 A1* 7/2005 Wikswo et al. ........... 435/287.1

* cited by examiner

*Primary Examiner*—Krishnan S Menon
(74) *Attorney, Agent, or Firm*—McCarter & English, LLP

(57) ABSTRACT

A system and method for integrating microfluidic components in a microfluidic system enables the microfluidic system to perform a selected microfluidic function. A capping module includes a microfluidic element for performing a microfluidic function. The capping module is stacked on a microfluidic substrate having microfluidic plumbing to incorporate the microfluidic function into the system. An infusion pump for delivering a fluid from a fluid source may be integrated in a microfluidic chip using a capping module having pumping components formed therein.

4 Claims, 10 Drawing Sheets

IMPLEMENTATION OF MICROFLUIDIC COMPONENTS IN A MICROFLUIDIC SYSTEM

RELATED APPLICATIONS

The present invention claims priority to U.S. Provisional Application Ser. No. 60/506,305 filed Sep. 25, 2003 and is a continuation-in-part of U.S. patent application Ser. No. 10/329,018, filed Dec. 23, 2002, now U.S. Pat. No. 6,878,271 which claims priority to U.S. Provisional Application Ser. No. 60/409,489 filed Sep. 9, 2002 and U.S. Provisional Application Ser. No. 60/410,685 filed Sep. 13, 2002 and is a divisional of U.S. patent application Ser. No. 10/951,473 filed Sep. 27, 2004, Now U.S. Pat. No. 7,455,770. The contents of the foregoing applications are expressly incorporated herein by reference.

FIELD OF THE INVENTION

The present invention relates to a microfluidic system for handling fluid samples on a microfluidic level. More particularly, the present invention relates to a system and method for implementing microfluidic functions in a microfluidic system.

BACKGROUND OF THE INVENTION

Microfluidic devices and systems provide improved methods of performing chemical, biochemical and biological analysis and synthesis. Microfluidic devices and systems allow for the performance of multi-step, multi-species chemical operations in chip-based micro chemical analysis systems. Chip-based microfluidic systems generally comprise conventional 'microfluidic' elements, particularly capable of handling and analyzing chemical and biological specimens. Typically, the term microfluidic in the art refers to systems or devices having a network of processing nodes, chambers and reservoirs connected by channels, in which the channels have typical cross-sectional dimensions in the range between about 1.0 µm and about 500 µm. In the art, channels having these cross-sectional dimensions are referred to as 'microchannels'.

In the chemical, biomedical, bioscience and pharmaceutical industries, it has become increasingly desirable to perform large numbers of chemical operations, such as reactions, separations and subsequent detection steps, in a highly parallel fashion. The high throughput synthesis, screening and analysis of (bio)chemical compounds, enables the economic discovery of new drugs and drug candidates, and the implementation of sophisticated medical diagnostic equipment. Of key importance for the improvement of the chemical operations required in these applications are an increased speed, enhanced reproducibility, decreased consumption of expensive samples and reagents, and the reduction of waste materials.

In the fields of biotechnology, and especially cytology and drug screening, there is a need for high throughput filtration of particles. Examples of particles that require filtration are various types of cells, such as blood platelets, white blood cells, tumorous cells, embryonic cells and the like. These particles are especially of interest in the field of cytology. Other particles are (macro) molecular species such as proteins, enzymes and poly-nucleotides. This family of particles is of particular interest in the field of drug screening during the development of new drugs.

In addition, it may be desirable to be able to pump small, controllable volumes of fluid from a fluid source to a destination, such as the body of a patient, while minimizing risk of contamination.

SUMMARY OF THE INVENTION

The present invention provides a system and method for integrating microfluidic components in a microfluidic system to enable the microfluidic system to perform a selected microfluidic function. The present invention utilizes a capping module including a microfluidic element for performing a microfluidic function. The capping module is stacked on a microfluidic substrate having microfluidic plumbing to incorporate the microfluidic function into the system.

According to one aspect, the invention provides a microfiltration system in a microfluidic chip for separating a substance, such as a compound, moving through a closed channel system of capillary size into different components. The filtration system of the invention provides a filtration module that can be assembled at low cost while providing an accurate means of filtering a large amount of compounds per unit of time. The microfiltration system integrates conventional membrane filter technology into a microfluidic system formed of glass, plastic or other suitable material. The microfabricated filtration system may comprise a sub-system designed to be inserted into a standard microfluidic system to provide on-chip filtration. An illustrative filtration system includes two flow paths separated by a membrane, which separates a substance flowing through a first flow path by size discrimination. Reservoirs are formed on either side of the membrane in communication with the flow paths. A microfabricated cap is affixed to the membrane to define the reservoir on the top side of the membrane.

According to another aspect, a pump, such as an infusion pump, may be incorporated into a microfluidic system using a plurality of capping structures having pump components formed therein. A first capping module is used to form a first fluid regulating device, such an inlet valve, for the pump. A second capping module forms a pump chamber in communication with the first fluid regulating device. A third capping module forms a fluid regulating device, such as an outlet valve, in communication with the pump chamber for regulating fluid flow from the pump chamber. Each capping module includes a membrane for selectively blocking flow through one or more communication ports in a substrate and an actuator assembly for controlling the position of the membrane.

According to yet another aspect, a microfluidic system comprises a first microchannel formed in a substrate, a first communication port coupling the first microchannel to a surface of the substrate, a first capping module defining a chamber, wherein the capping module is adapted to be stacked on the substrate and placed in communication with the microchannel, a movable membrane connected to the chamber, and an external actuator for selectively moving the membrane to vary the size of the chamber to control fluid flow from the first microchannel through the chamber.

According to another aspect of the invention, an infusion pump for delivering a substance is provided. The infusion pump comprises a substrate having a plurality of microchannels formed therein, wherein each microchannel includes one or more communication ports for connecting the microchannel to a surface of the substrate, a first capping module forming a pump chamber in communication with a first microchannel and second microchannel, a second capping module forming an inlet fluid regulating device in communication with the pump chamber via the first microchannel for controlling fluid flow into the pump chamber and a third capping module forming an outlet fluid regulating device communication with the pump chamber via the second microchannel for controlling fluid flow out of the pump chamber.

According to still another aspect of the invention, a method of delivering a fluid from a fluid source is provided. The method comprises a first step of providing a pump comprising a microfluidic substrate having a first capping module stacked thereon to form a pump chamber, a second capping module stacked thereon to form an inlet fluid regulating device to the pump chamber and a third capping module stacked thereon to form an outlet fluid regulating device from the pump chamber, each capping module defining a chamber in communication with an inlet channel and an outlet channel formed the microfluidic substrate and having a flexible membrane forming a side wall of the chamber to selectively block fluid flow through the chamber. A second step comprises selectively deflecting at least one of the membranes of the capping modules to pump fluid from the fluid source through the infusion pump.

DETAILED DESCRIPTION OF THE INVENTION

Figure 1:
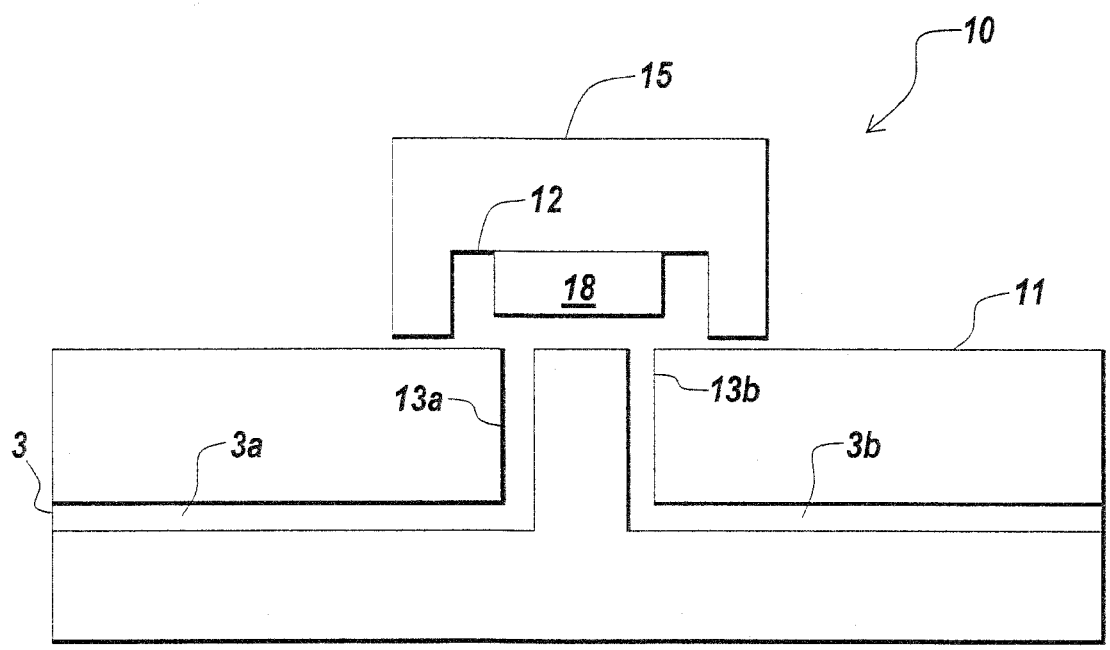
FIG. 1 illustrates a microfluidic system including a capping structure for integrating a microfluidic function into the microfluidic system.

The present invention provides a microfabricated pump system for allowing on-chip pumping of a sample. The microfabricated pump system may be used in a wide variety of applications, including, but not limited to infusion pumps for delivering a drug to a patient, and other microfluidic applications. The present invention will be described below relative to an illustrative embodiment. Those skilled in the art will appreciate that the present invention may be implemented in a number of different applications and embodiments and is not specifically limited in its application to the particular embodiments depicted herein.

As used herein, the term "microfluidic" refers to a system or device for handling, processing, ejecting and/or analyzing a fluid sample including at least one channel having microscale dimensions.

The terms "channel" and "flow channel" as used herein refers to a pathway formed in or through a medium that allows for movement of fluids, such as liquids and gases. The channel in the microfluidic system preferably have cross-sectional dimensions in the range between about 1.0 µm and about 500 µm, preferably between about 25 µm and about 250 µm and most preferably between about 50 µm and about 150 µm. One of ordinary skill in the art will be able to determine an appropriate volume and length of the flow channel. The ranges are intended to include the above-recited values as upper or lower limits. The flow channel can have any selected shape or arrangement, examples of which include a linear or non-linear configuration and a U-shaped configuration.

The term "microfluidic element" as used herein refers to a component in a microfluidic system for performing a microfluidic function. Examples of suitable microfluidic elements include, but are not limited to, passive check valves, active valves, pressure sensors, connecting channels, membrane filtration units, threaded taps for external connecting tubes, compression chambers, pumps, and others known to those of ordinary skill in the art.

The term "filter" as used herein refers to a material of any suitable composition and size, which may used to separate or filter substances by size exclusion or other measures.

The term "substrate" as used herein refers to a support structure having channels formed therein for conveying a fluid.

The terms "cap" or "capping module" as used herein refer to a structure, which is the same size as or smaller than a substrate, having any selected size or shape and formed of any selected material, and having a microfluidic element. The capping module is configured to stack on or communicate with the substrate to fully or partially complete a fluid path.

The term "substance" as used herein refers to any material used in a microfluidic process, including, but not limited to chemical compounds, molecules, viruses, cells, particles, beads, buffers, or any other material used in a microfluidic process.

The term "microfluidic function" as used herein refers to any operation, function or process performed or expressed on a fluid or sample in a microfluidic system, including, but not limited to: filtration, dialysis, pumping, fluid flow regulation, controlling fluid flow and the like.

The term "port" refers to a structure for providing fluid communication between two elements.

As used herein, "pump" or "pumping element" refers to any fluid-transferring device suitable for intaking and/or discharging fluids, which can have different sizes, including microscale dimensions, herein referred to as "micropump" or "microfluidic pump" or "pumping element".

The present invention allows implementation of different microfluidic functions into a microfluidic chip using a capping module having a microfluidic element for performing a microfluidic function. As shown in FIG. 1, a microfluidic chip 10 suitable for implementing an embodiment of the invention comprises a substrate 11 having one or more flow channels 3, illustrated as a microchannel, disposed therein. The flow channels transport fluid through the microfluidic system 10 for processing, handling, and/or performing any suitable operation on a liquid sample. The microfluidic system 10 may comprise any suitable number of flow channels 3 for transporting fluids through the microfluidic system 10.

As shown in FIG. 1, the flow channel 3 is formed in a substrate 11, and may connect to the surface of the substrate via one or more communication ports 13a and 13b. A capping module 15 including a microfluidic element 18, such as a filter, one or more valves, pressure sensors or other component for performing a microfluidic function, is placed over the substrate 11 to form a closed fluid path. According to an alternate embodiment, the capping module may include a connector channel for re-routing fluid flow through the microchannel around another structure. The illustrative substrate 11 includes two communication ports 13a, 13b, each connecting unconnected segments 3a, 3b of the flow channel 3 to the substrate surface, though one skilled in the art will recognize that variations may be made in the size, number and configuration of the communication ports and flow channels.

The illustrative capping module 15 may include connector ports for interfacing with the communication ports of the substrate, and/or a chamber 12 or channel to provide a fluidic path between the first connector port and the second connector port. One skilled in the art will recognize that the capping module may have alternate configurations and is not limited to the embodiment shown in FIG. 1.

Using the capping module 15, microfluidic functions, such as filtration, dialysis, pumping, flow control and so on, may be integrated into the microfluidic system 10 without requiring significant modification of the substrate 11. A substrate including any number and arrangement of conduits or channels 3 for conveying fluids can be transformed into a functional fluidic circuit by selecting and placing one or more capping modules 15 with a functional microfluidic element 18 on the substrate, i.e. chip. According to an illustrative embodiment, the same automated "pick and place" surface mount equipment technology used to make integrated circuits may be used to form fluidic circuits on a substrate having microchannels using various capping structures. Suitable pick and place equipment is manufactured by Manncorp, Inc. (Huntingdon Valley, Pa.), among others.

To fabricate a fluidic circuit, the channels 3 in the substrate 11 may be manufactured by chip microfabrication. The channels or plumbing may be fabricated by etching half-channels in a first substrate, followed by bonding and/or lamination of a second substrate to enclose the half-channels, forming a microchannel. The substrate may be formed of one or more layers containing etched channels if more complex fluidic networks are required. The communication ports may then be fabricated in the substrate to connect the microchannel to an exterior surface of the substrate. Suitable techniques for fabricating the communication ports include drilling, laser etching, powder blasting or other techniques known in the art. After the fabrication of the substrate and communication ports, a capping module having a desired functionality is bonded to the substrate to form a microfluidic component in the larger microfluidic circuit.

A variety of capping module number and sizes may be bonded to the substrate to impart various microfluidic functions to form a microfluidic system. The capping modules may be removable and replaceable so that a substrate may be re-used.

According to the illustrative embodiment, the capping module has a cross-sectional dimension of between about 1 millimeter and about 5 centimeters, though those skilled in the art will recognize that the invention is not limited to this range. The capping module may be formed of any suitable material, including, but not limited to plastic, glass, silicon and other materials known in the art.

Figure 2:
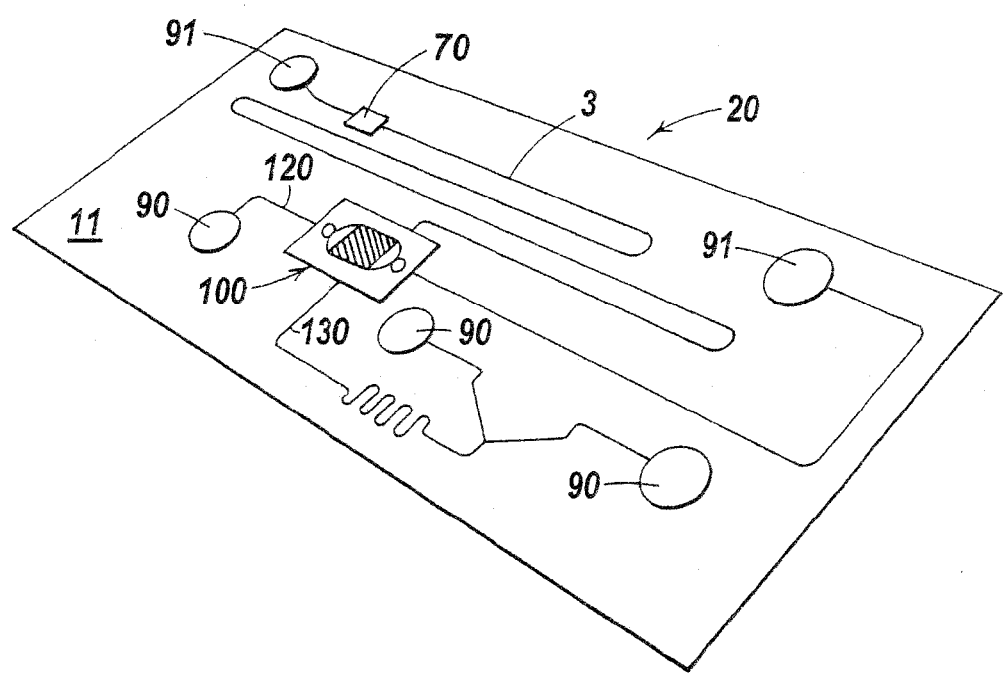
FIG. 2 illustrates a diagnostic microfluidic chip suitable for including a microfiltration system according to an illustrative embodiment of the invention.

FIG. 2 illustrates the architecture of an illustrative microfluidic diagnostic chip that may be fabricated according to the teachings of the invention. The diagnostic chip 20 may include one or more microfluidic components, alone or in combination, configured to facilitate processing of a sample. For example, as shown, the diagnostic chip 20 includes a microfiltration system 100 for separating substances in solution, such as separating selected particles from cells or other particles in a suspension. The diagnostic chip 20 may further include one or more reservoirs 90 for storing and supplying sample, reagent or other compounds to the system, as well as one or more waste reservoirs 91 for collecting sample waste. The diagnostic chip may further include one or more aliquoting, mixing and incubation components, such as an on-chip sample dilution system, for processing a sample, such as performing a mixture of a specific amount of sample and reagent. For example, the illustrative system includes a mixing component 60 and an incubation region 61. The chip may also include a detector 70 for analyzing a filtered product from the microfiltration system 100. The detector 70 may utilize any suitable detection modality, including, but not limited to fluorescence, electrochemical analysis, dielectrophoresis, and surface plasma resonance (SPR), radio-frequency, thermal analysis and combinations thereof. The chip 10 may employ valves for selectively controlling the flow of fluid through the channels and one or more drive units, located on or off the chip, for driving the movement of fluid through the channels 3 of the chip. One skilled in the art will recognize that the microfluidic system is not limited to the diagnostic chip of FIG. 2 and that variations in the configuration, position, number and combination of the various microfluidic components may be made in accordance with the present invention.

The filtration system 100 of the present invention integrates conventional membrane filter technology into a microfluidic chip using a capping module. The filtration system can be inserted into an existing microfluidic chip to enable filtration of particles, cells or other substances in suspension without requiring significant or expensive modification of the chip structure.

Figure 3:
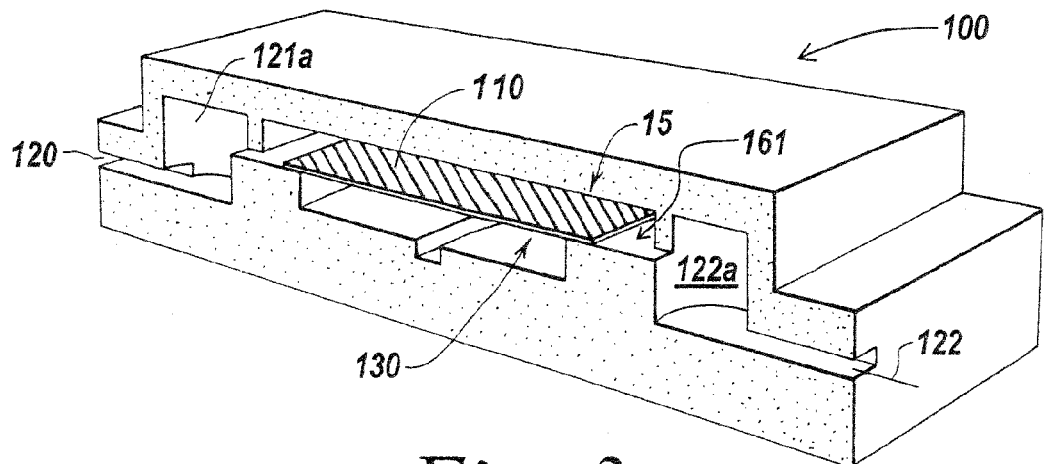
FIG. 3 is a perspective, cross-sectional view of the microfiltration system in the chip of FIG. 2 according to an illustrative embodiment of the invention.
Figure 4:
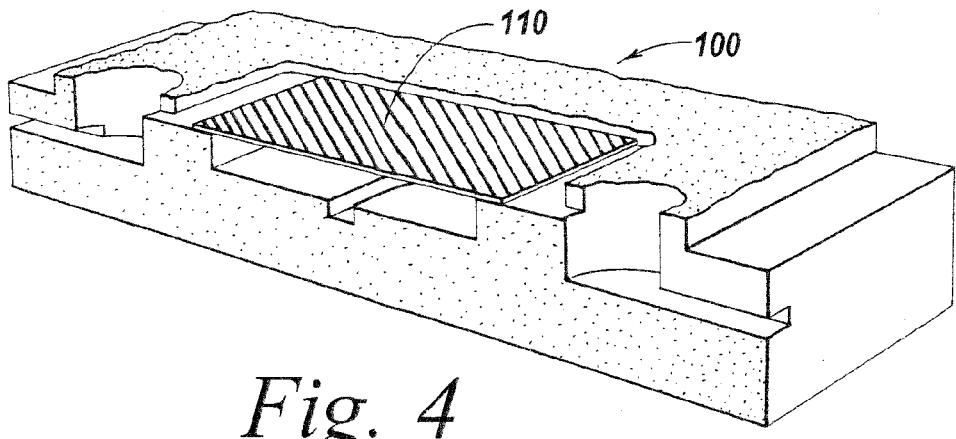
FIG. 4 is a detailed view of the membrane on the microfiltration system of FIG. 3.
Figure 5:
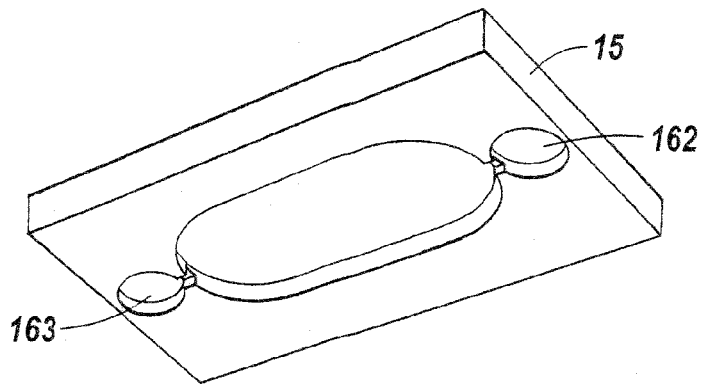
FIG. 5 illustrates the microfabricated cap of the microfiltration system of FIG. 3.
Figure 6:
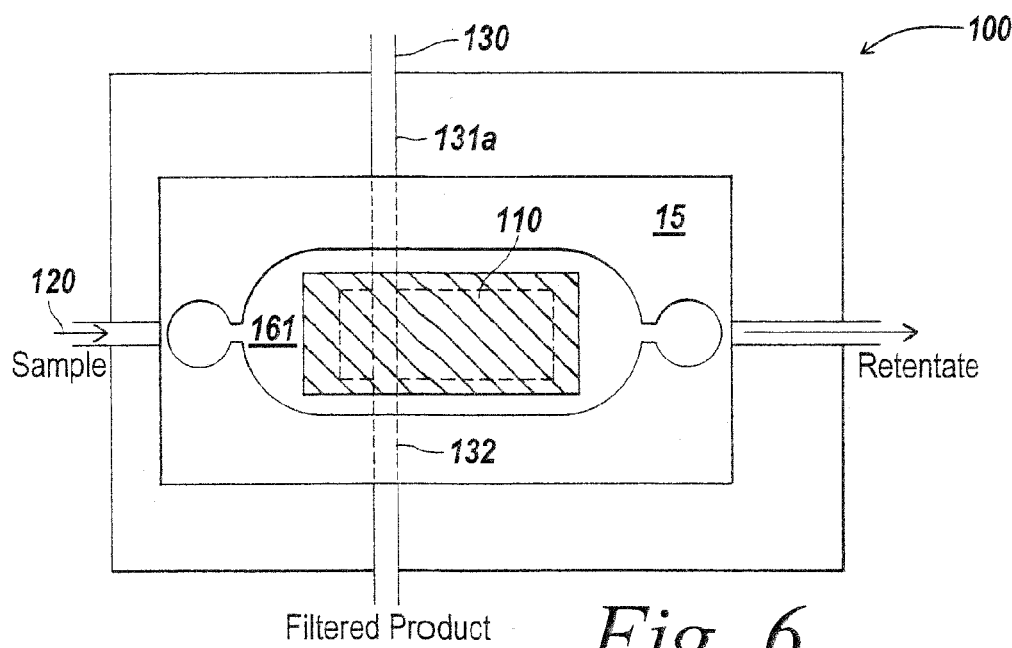
FIG. 6 is a top view of the microfiltration system of FIG. 3.

FIGS. 3, 4 and 6 illustrate a microfabricated filtration subsystem 100 suitable for implementation in the microfluidic system of FIG. 2 according to one embodiment of the invention. FIG. 5 illustrates the capping module 15 used to fabricate the filtration system 100 according to one embodiment of the invention. The filtration subsystem is utilized to separate a substance, such as a sample comprising a mixture of particles and fluid, through a semi-permeable membrane filter 110 and subsequently collect the separated components. According to an illustrative embodiment, the filtration subsystem is used to separate blood cells from plasma, though one skilled in the art will recognize that other applications are included in the invention. According to other applications, the filtration system may be used to separate viruses from cells, beads from cells, chemical compounds, molecules or other substances that a membrane filter may be used to separate. As shown the filtration subsystem 100 is formed directly on the microfluidic chip to add filtration capability to the chip without requiring significant modification or expense.

The filtration subsystem 100 utilizes a conventional membrane filter 110 separating two flow paths in the substrate 11 to provide small volume controllable filtration of a sample. The illustrative filtration system is a four-port transverse filter, which includes a first fluid flow path 120 for supplying a substance to the filtration system, such as a mixture of particles and fluid, and a second fluid flow path 130 for receiving and conveying a filtered product (i.e., a filtrate) from the filtration system. The first fluid flow path 120 includes a first communication port, illustrated as a first inlet channel 121 that intersects the filtration system at a first inlet 121a. The first fluid flow path 120 includes a second communication port, illustrated as a first outlet channel 122 including an outlet 122a from the filtration chamber for receiving and conveying a retentate of the substance from the filtration system. The second fluid flow path includes an inlet channel 131 intersecting a filtrate chamber below the membrane filter 110 at a second inlet and a second outlet channel 132 for transferring the filtered product from the filtration system. The second fluid flow path 130 may include a carrier fluid for conveying the filtered product. A flow source drives the flow of the mixture through the filtration system to effect separation of the components through the membrane filter. The flow source may comprise an off-chip syringe pump, a microfabricated peristaltic pump, a microfabricated syringe, or any suitable flow source known in the art, such as those described in U.S. Provisional Patent Application Ser. No. 60/391,868 entitled "Microfluidic System and Components", the contents of which are herein incorporated by reference.

The illustrative microfabricated filtration system 100 has a relatively small footprint (less than about one mm$^2$), resulting in a compact structure, low cost and relatively simple fabrication. The particle separator further provides relatively low strain rates with reduced or no blockage. The amount of fluid retained can be significant, if desired, and the design is scalable and repeatable for additional parsing steps, if desired.

The filtration subsystem of the present invention may be formed by providing a microfluidic chip including an intersection 101 of the two flow channels 120, 130. The assembly process integrates simple batch fabricated components, and is relatively simple and low cost at high volume. According to an illustrative embodiment, the chip forms a recess 140 in communication with the second flow channel 130 at the intersection 101. The first flow channel 120 is initially separated from and divided by the recess 140. A suitable membrane filter 110 is affixed to the microfluidic chip, using an appropriate adhesive or other suitable fastening mechanism, to cover the recess, thereby defining a reservoir below the membrane filter for receiving the filtered product and transmitting the filter product through the second flow channel 130. The membrane filter may comprise any suitable filtering membrane known in the art.

The illustrative microfabricated capping module 15, shown in FIG. 4, is affixed above the membrane filter 110 to define a filtration chamber 161 in communication with the first flow channel 120. The cap 15 may be affixed using an appropriate adhesive or other suitable fastening mechanism. The illustrative capping module 15 includes an inlet 162 and an outlet 163 in communication with the filtration chamber to connect the first flow channel 120 with the filtration chamber 161 and enable flow of a composition to be filtered through the filtration chamber over the membrane filter. Alternatively, the membrane filter 110 is affixed directly to the capping module 15 and the capping module is affixed to the substrate to integrate the filtration system onto the substrate. One skilled in the art will recognize that the capping module is not limited to the illustrative embodiment and that variations may be made in accordance with the teachings of the invention.

Figure 7:
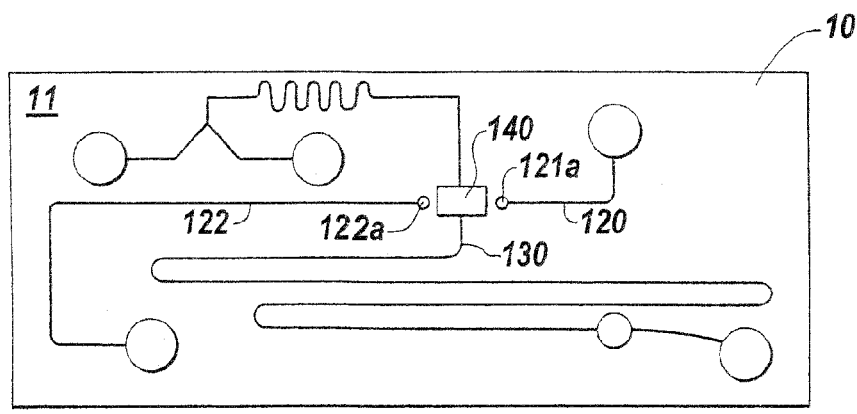
FIG. 7 is a top view of the diagnostic chip of FIG. 2 before assembly of the microfiltration system.
Figure 8:
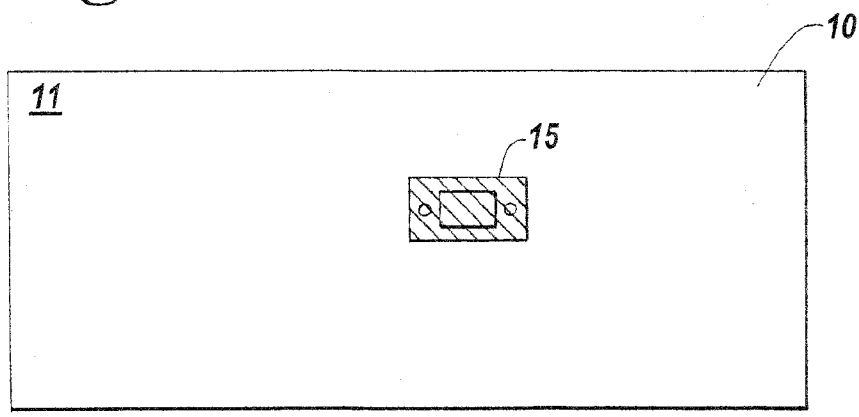
FIG. 8 is a top view of the diagnostic chip of FIG. 2 after assembly of the microfiltration system.

FIG. 7 illustrates the microfluidic system 10 including channels 3 prior formed therein prior to assembly of the capping module 15 including the membrane filter 110. FIG. 8 is a top view of the capped microfluidic system 10 incorporating filtering capability.

The composition to be filtered is introduced to the filtration subsystem from the inlet channel and passes into the filtration chamber and over the membrane filter 110. The components of the substance are fractionated by the membrane filter 110, with the smaller components, such as plasma, passing through the membrane filter, into the reservoir 140 and through the second flow channel 130. The remaining portion, such as blood cells, passes through the filtration chamber to the outlet of the first flow channel 120.

According to the illustrative embodiment, the substrate of the microfluidic chip may be formed of glass, plastic, silicon, quartz, ceramics or any other suitable material. In a microfluidic chip manufactured from glass, the chip may comprise two layers: the chip and the cap affixed to the chip to define the filtration subsystem. In a microfluidic chip formed of plastic, the components may be stamped into the plastic substrate.

Figure 9A:
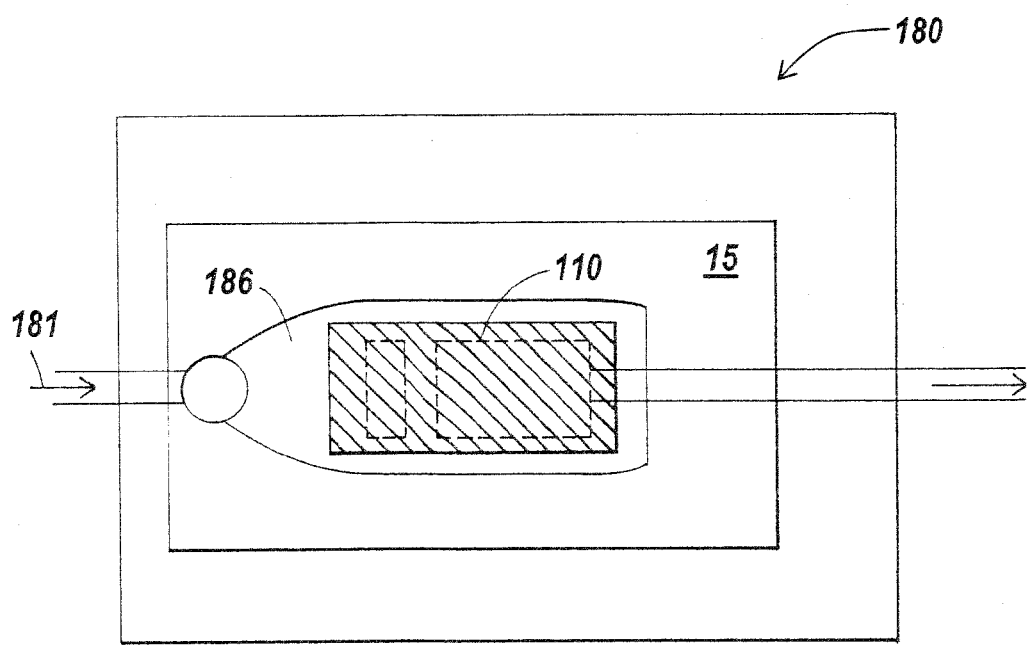
FIG. 9A is a top view of a two port direct microfiltration system according to an alternate embodiment of the invention.
Figure 9B:
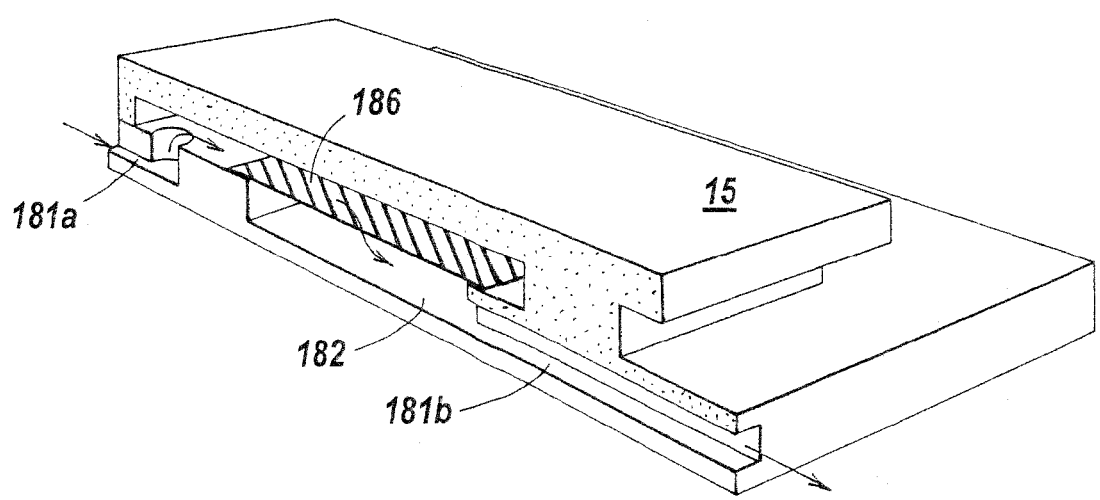
FIG. 9B is a perspective cross-sectional view of the microfiltration system of FIG. 9A.

According to an alternate embodiment, shown in FIGS. 9a and 9b, the microfiltration subsystem may comprise a two-port direct filter 180 comprising a membrane filter 110 inserted into a fluid flow path 181. As shown, the two-port direct filter 181 comprises a fluid flow path 181 formed in a microfluidic substrate, which is divided into two sections 181a, 181b. The second section 181b defines a recess 182 and the membrane filter 110 is adhered over the recess to define a filtrate chamber for receiving a filtered product. A microfabricated cap 15 including a recess 186 defining a filtration chamber is attached to substrate above the membrane filter to connect the flow path 181. The substance to be filtered is conveyed through the fluid flow path 181 into the filtration chamber 186 and passes through the membrane filter 110. The membrane filter 110 separates the substance by trapping larger molecules and the filtered product, comprising the remaining molecules, passes through the membrane filter along the fluid flow path 181 into the recess 182 and out of the microfiltration system for further analysis, processing collection, etc.

Figure 10A:
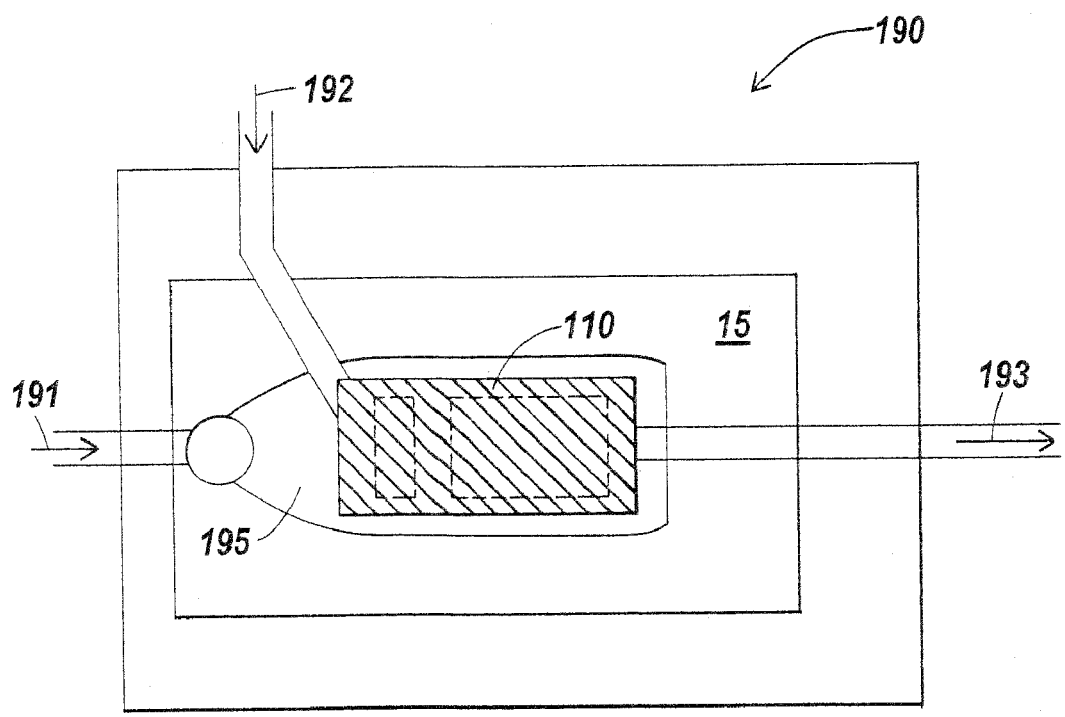
FIG. 10A is a top view of a three port direct microfiltration system according to an alternate embodiment of the invention.
Figure 10B:
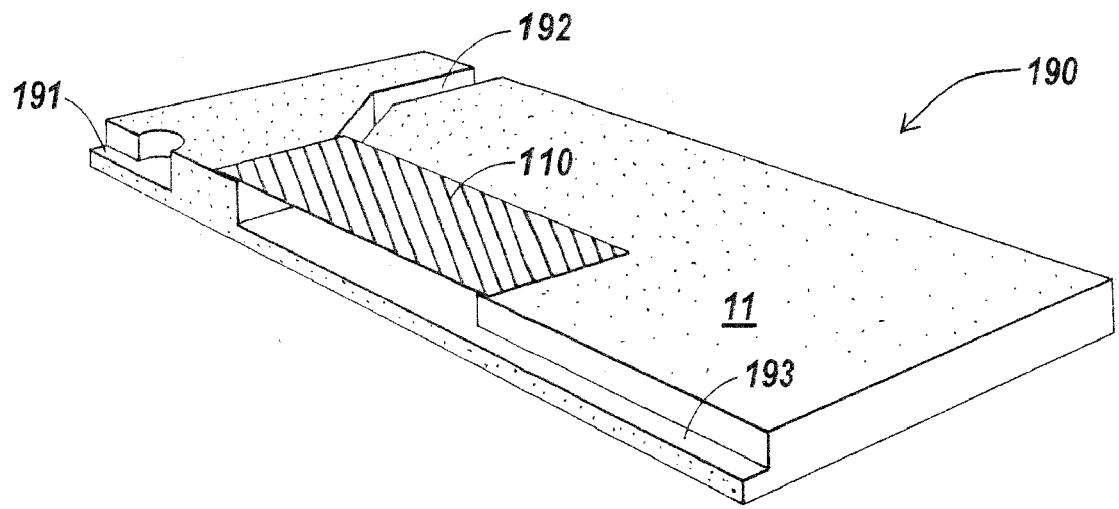
FIG. 10B is a perspective cross-sectional view of the microfiltration system of FIG. 10A, with the microfabricated cap removed.

According to yet another embodiment, shown in FIGS. 10a and 10b, the microfiltration system may comprise a three port direct filter 190. The three port direct filter 190 includes two inlet flow channels 191, 192 for inputting two samples to a filtration chamber 195 and a single outlet channel 193 for conveying a filtered product from the filter 190. The three-port direct filter includes a microfabricated cap 15 defining the filtration chamber and a membrane filter 110 separating the filtration chamber from the outlet channel 193. In operation, two samples may be provided through the inlet channels 191, 192. The samples mix together in the filtration chamber 195 and the sample mixture is filtered through the membrane filter, which separates the components of the sample mixture. The filtered product that passes through the membrane filter is conveyed through the outlet channel for further processing, analysis, collection etc.

One skilled in the art of membrane based separations will recognize that the filtration system described here can be used to implement on-chip separations of all types for which membranes may be found, including separating molecules by size or beads from molecules or small particles from large particles or viruses from cells or other separations known to those skilled in the art.

Figure 11:
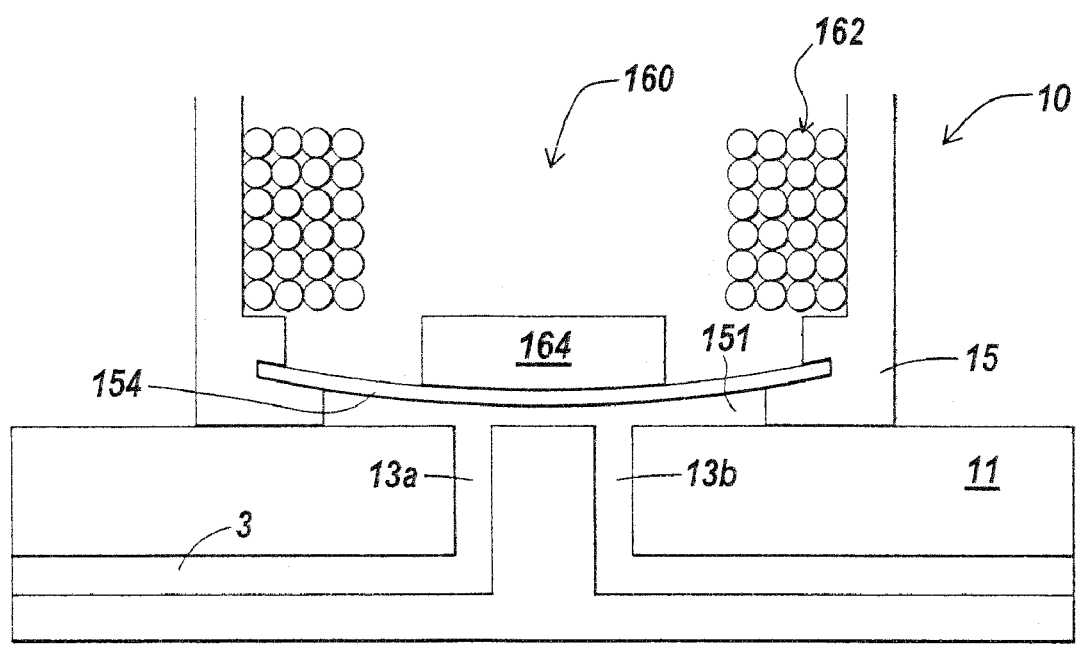
FIG. 11 illustrates an electromagnetic valve incorporated into a microfluidic system according to an embodiment of the invention.

According to another embodiment of the invention, the capping module 15 may be used to incorporate an electromagnetic valve into a microfluidic system. An example of an electromagnetic valve component housed in a capping structure for implementation in a microfluidic system according to the teachings of the invention is shown in FIG. 11. As shown, the electromagnetic module 150 comprises a cap 15 defining an interior chamber 151, a membrane 154 for selectively blocking flow through one or both of the communication ports in the substrate and an actuator assembly 160 for deflecting the membrane 154. The membrane 154 used in the electromagnetic valve is preferably impermeable to liquids, in contrast to the membrane used in filtration systems described above, which is semipermeable to allow selected substances to flow therethrough. According to the illustrative embodiment, the actuator assembly comprises a coil 162 and a magnet 164. One skilled in the art will recognize that other suitable means for deflecting the membrane may be used, including piezoelectric actuators.

The electromagnetic capping module 110 may be stacked on the substrate 11 such that the membrane, when deflected, blocks one or more of the communication ports 13a and 13b. The electromagnetic capping module 110 thus integrates a valve for selectively blocking flow through the channel 3 into the microfluidic flow path. As described above, the electromagnetic capping module may be placed on the substrate using automated "pick and place" equipment or through any suitable means known in the art.

Figure 12:
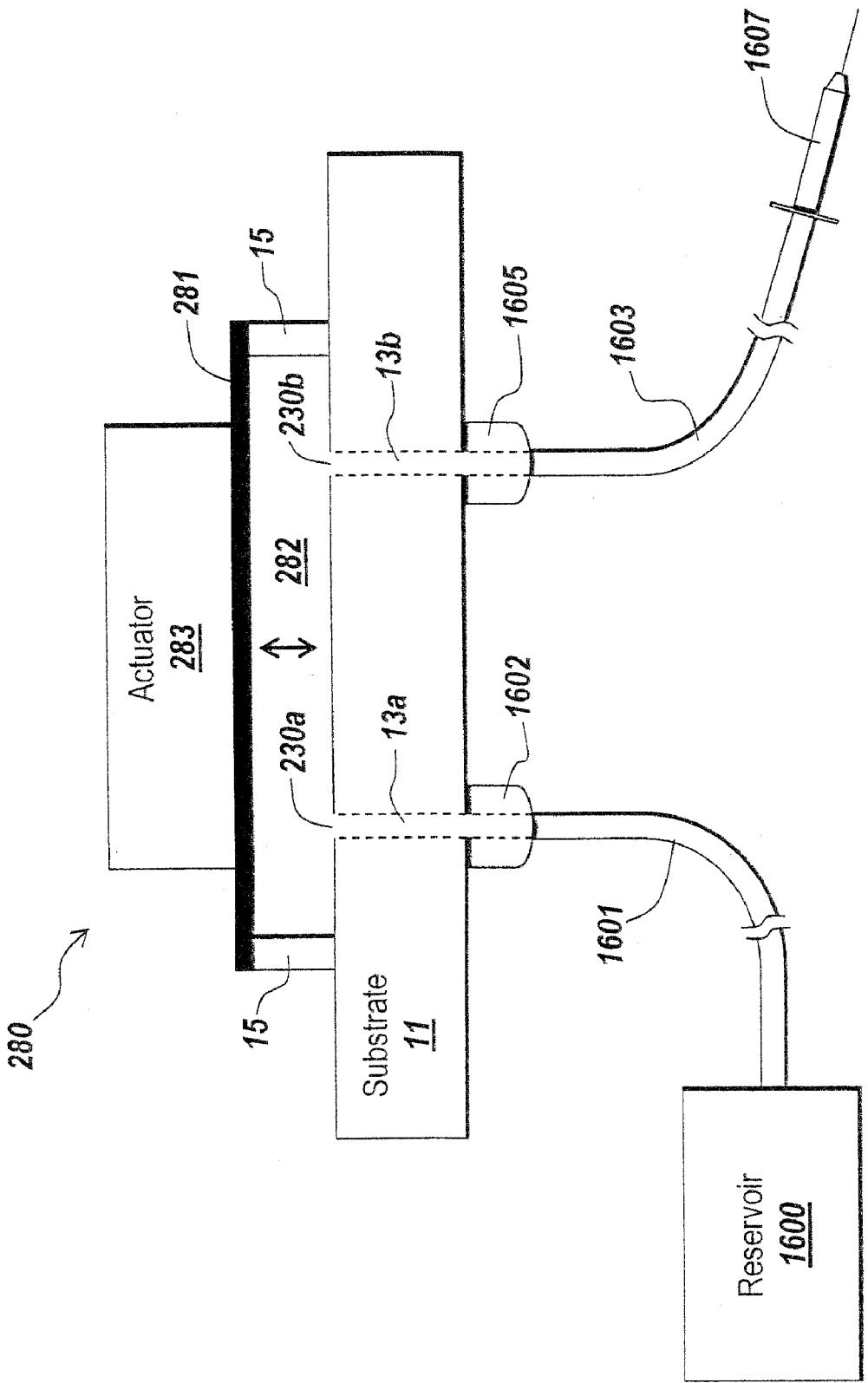
FIG. 12 illustrates a pump incorporated into a microfluidic system according to an embodiment of the invention.

Another microfluidic element that may be integrated into a basic fluidic chip using a capping module is a pump, as shown in FIG. 12. A pumping function may be integrated into a capping module through a microfuidic element capable of performing the pumping function and introduced to a microfluidic chip by stacking the capping module onto the substrate of the chip. For example, in the embodiment of FIG. 12, the microfluidic pumping element comprises a flexible membrane 281 forming a wall of a chamber 282 defined by the capping module 15. As shown, when the capping module 15 is stacked on the substrate 11, the chamber 282 is placed into communication with the channels 13a, 13b on the chip. A first channel 13a interfaces with the chamber via an inlet communication port 230a and forms an inlet for the chamber 282. A second channel 13b interfaces with the chamber 282 via an outlet communication port 230b and forms an outlet from the chamber. An actuator 283 in communication with the capping module 15 selectively actuates the pumping element, for example, by deflecting the membrane 281 to increase or decrease the size of the chamber 282. The communication ports 230a, 230b of the fluidic chip may be selectively opened or closed to facilitate the pumping action.

The pump 280 formed by the capping module 15 may be used to deliver fluids, such as drugs, from a source, such as a reservoir, to a destination, such as a patient. As shown, a tube 1601 connected to a reservoir 1600 may be placed in communication with the inlet channel 13a via a suitable fitting 1602 to deliver fluids to the pump 280. A delivery tube 1603 is placed in communication with the outlet channel 13b via a fitting 1605. The delivery tube may be connected to a syringe 1607 or other device for delivering fluids pumped through the pump 280 to a patient. The fittings 1603 and 1605 preferably seal the tubes to the channels to ensure no leakage of the fluid. Suitable fittings are known in the art and include, but are not limited to luer connectors, rubber septum, an internal or external threaded connection, fittings that couple components through interference fit or any suitable means known in the art for coupling a first component to a second component.

Figure 13A:
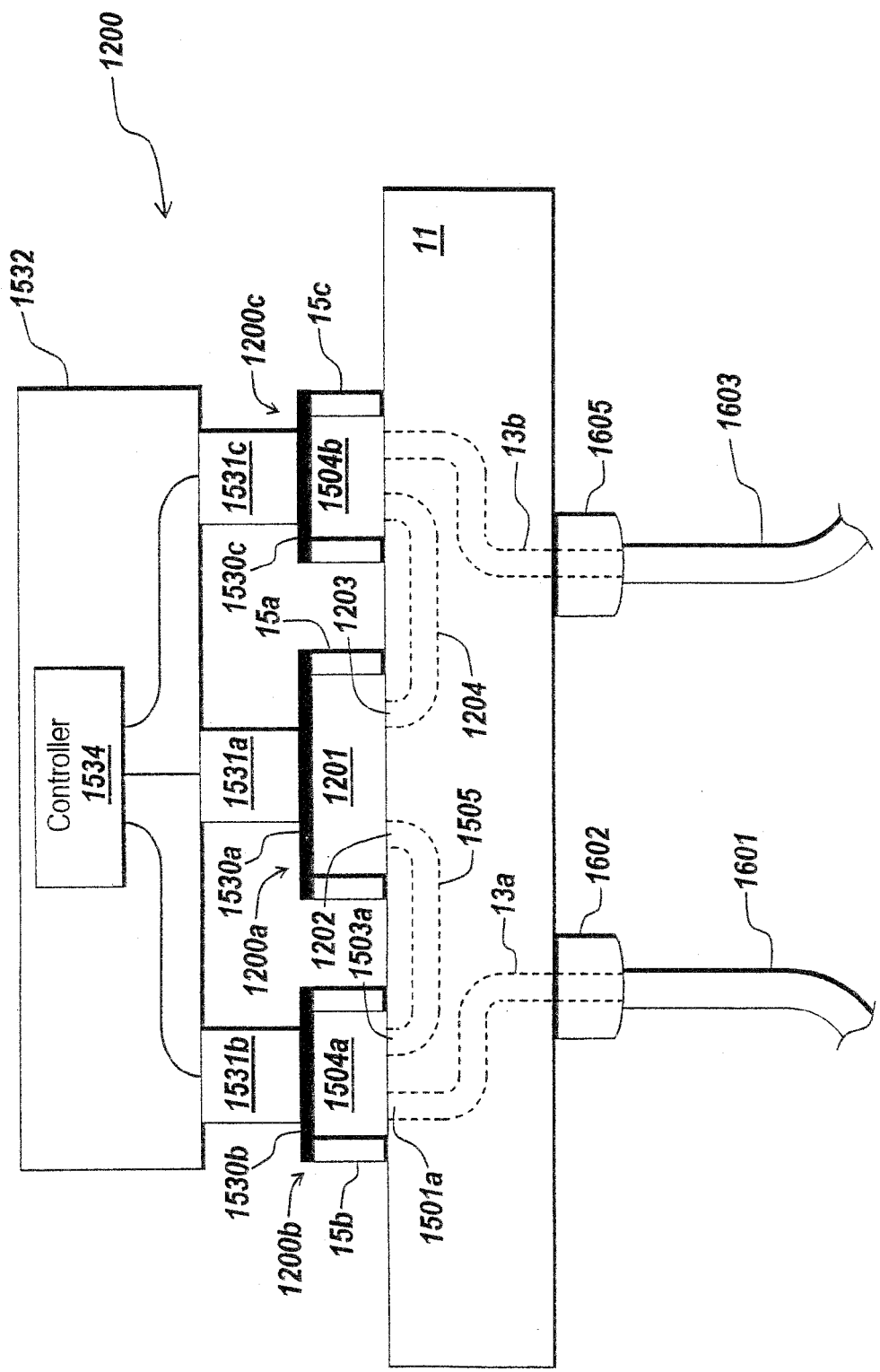
FIG. 13A illustrates a pump incorporated into a microfluidic system using a plurality of capping modules according to an embodiment of the invention.
Figure 13B:
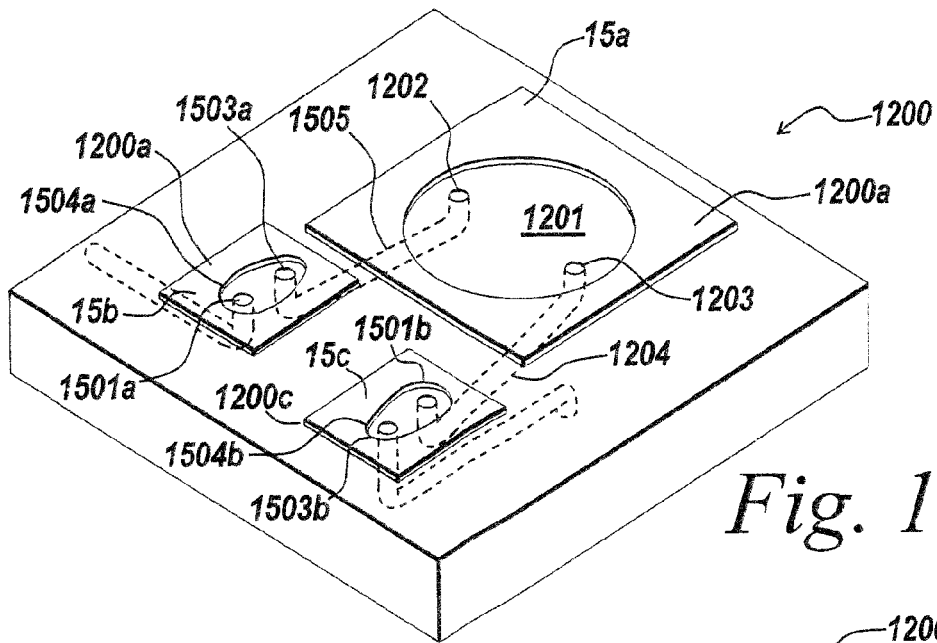
FIG. 13B is a perspective view of the pump of 13A without membranes or actuators.

According to another embodiment of the invention, a plurality of capping modules 15 may be used to incorporate a pump, such as an infusion pump for delivering a drug to a patient, into a microfluidic system. An example of a pump formed using a plurality of capping modules according to the teachings of the invention is shown in FIGS. 13A and 13B. According to the embodiment of FIG. 13A, the illustrative infusion pump 1200 is formed using three capping module mounted on a substrate 11 having channels formed therein. A first capping module 15a forms a pump chamber 1201 for pumping fluids, while a second capping module 15b forms a fluid regulating device, such as an inlet valve, to regulate flow to the pump chamber and a third capping module 15c forms a fluid regulating device, such as an outlet valve, to regulate flow from the pump chamber. The second capping module communicates with an inlet channel 13a in the substrate, while the third capping module communicates with an outlet channel 13b in the substrate. A first connecting channel 1505 formed in the substrate places the first capping module and the second capping module in fluid communication with each other, while a second connecting channel 1204 formed in the substrate places the first capping module in fluid communication with the third capping module, when the capping modules are stacked on the substrate.

According to the illustrative embodiment, each capping module 15a, 15b and 15c further includes a membrane 1530a, 1530b, 1530c, respectively, for selectively blocking the flow of fluid through the pump component formed by the respective capping module. An external actuator 1531a, 1531b, 1531c selectively actuates each membrane, as described in detail below. FIG. 13B illustrates the capping modules assembled on the chip 11 with the membranes removes to illustrate the configuration and connection of each capping module 15a, 15b, and 15c when assembled.

As shown in FIGS. 13A and 13B, the first capping module 15a forms a pump chamber component 1200a and includes a recess or opening defining the pump chamber 1201. The pump chamber 1201 is placed over communication ports in the substrate 11, so that a first communication port forms an inlet port 1202 to the pump chamber 1201 and a second communication port forms an outlet port 1203 to the pump chamber 1201 when the capping module is stacked on the substrate. In an alternate embodiment, a recess may be formed in the substrate 11 to form the pump chamber 1201 when the capping module 15a is coupled to the substrate.

A second capping module 15b forms an inlet valve 1200b for the pump chamber 1201. The inlet valve 1200b includes an inlet valve chamber 1504a formed by a recess or opening in the capping module 15b, an inlet port 1501a forming an interface between the chamber 1504a and an inlet channel 13a formed in the substrate 11. An outlet port 1503a forms an interface between the chamber 1504a and an outlet channel 1505 formed in the substrate 11. The inlet channel 13a may be connected to a reservoir containing a supply of liquid, such as a drug, to be pumped through the pump 1200 through any suitable means, such as a tube 1601 connecting the reservoir to the inlet channel and a fitting 1602 for sealingly connecting an end of the tube to the inlet channel 13a. The outlet channel 1505 of the inlet valve connects to the pump chamber 1201 via the chamber inlet port 1202. In one embodiment, the substrate 11 may have a recess around the ports 1501a and 1503a to form the inlet valve chamber 1504a when the second capping module 15b is coupled to the substrate.

Figure 14:
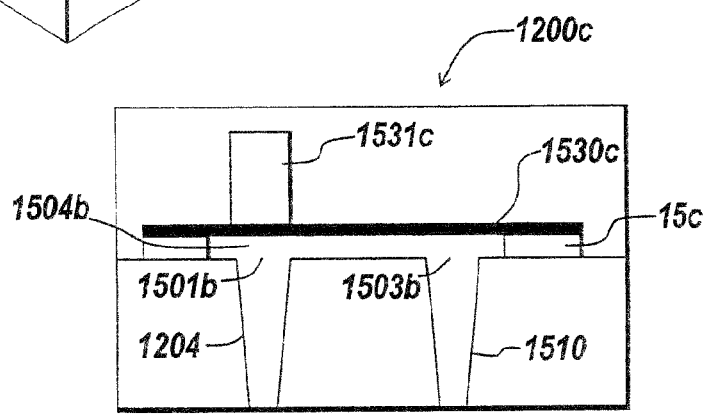
FIG. 14 is a cross sectional view of an outlet valve of the pump of FIG. 13A.

The third capping module 15c forms an outlet valve 1200c from the pump chamber 1201. FIG. 14 is a cross-sectional view of the outlet valve 1200c according to an illustrative embodiment of the invention. The outlet valve 1200c includes an outlet valve chamber 1504b formed by a recess in the capping module, an inlet port 1501b, and an outlet port 1503b. The inlet port 1501b of the outlet valve 1200c communicates with an outlet channel 1204 extending from the pump chamber 1201, such that liquid pumped from the pump chamber passes through the outlet valve 15c. The outlet port 1503b of the outlet valve connects to an outlet channel 13b for the pump 1200. According to an illustrative embodiment, the outlet channel 13b is connected to a patient to deliver fluid, such as a drug, pumped through the pump 1200 to the patient. The outlet channel 13b can be connected to a patient through any suitable means known in the art, such as through a tube sealingly coupled to the outlet channel 13b through a fitting or other suitable device. In one embodiment, the substrate 11 may have a recess around the ports 1501b and 1503b to form the inlet valve chamber 1504b when the third capping module 15c is coupled to the substrate.

Each capping module may be coupled to the substrate to form the associated pump component through any suitable means. For example, the substrate 11 may includes recesses configured to receive complementary portions of the capping module when the capping module is stacked on the substrate. Alternatively, the substrate 11 may include protrusions or other features configured to be inserted in recesses formed in the sidewalls of the capping modules. In another embodiment, an adhesive film or other suitable bonding means may be used to adhere or otherwise bond the capping module to the substrate. The capping modules may be manually assembled on the substrate or assembled using automated machinery.

In the embodiments shown in FIGS. 13A, 13B and 14, the opening forming each chamber 1201, 1504a, 1504b extend through the respective capping module, and each capping module 15a, 15b, 15c includes a membrane 1530a, 1530b 1530c forming an upper wall of the chamber 1504a, 1504b, 1504c, respectively. An external actuator 1531a, 1531b and 1531c is provided for selectively moving each membrane 1530a, 1530b or 1530c by a predetermined amount to selectively block the inlet port 1501b and/or the outlet port 1503b associated with the capping module. The external actuators can be mounted in a holder 1532, which may include a controller 1534 and associated electronics for controlling the actuation of each actuator. A battery (not shown) or other suitable power source may be used to power the actuators 1531a, 1531b and 1531c.

The membrane may comprise any suitable material suitable for selectively controlling fluid flow through the associated capping module. The illustrative membranes 1530a, 1530b, 1530b have a stiffness such that the membrane returns to a rest position when the associated actuator 1531 is not activated. In other embodiments, the actuator can actively return the membrane to a rest position. According to one embodiment, the membrane 1530a for the pump chamber 1201 is formed of a relatively stiff material, such as stainless steel. The valve membranes 1530b and 1530c may be formed of a relatively compliant material, such as corrugated metal or plastic, to ensure a seal when the membrane is deflected over a port of the inlet or outlet valve. In an illustrative embodiment, the pump chamber membrane 1230a is formed of stainless steel that is about fifty millimeters thick, while the valve membranes 1230b, 1230c are formed of plastic that is about fifty millimeters thick. The membranes may be shaped or bossed to achieve desirable deflection characteristics. In the illustrative embodiment, the membrane is rigidly clamped at the edges and undergoes linear elastic deformation to control fluid flow. In another embodiment, the membrane may be circular in shape and move like a piston in the vertical direction to control fluid flow.

The actuators can comprise any suitable component for selectively deflecting a membrane. According to the illustrative embodiment, the actuator 1531 may comprise a solenoid, piezo stack, electromagnetic component or other suitable component for actuating the membrane to selectively block fluid flow through a capping module. The actuator is selected to provide a suitable force to drive the associated membrane to a specified deflection distance, provide a suitable pressure drop for a target flow rate and overcome back pressure to return the membrane to a rest position.

In one embodiment, the actuators mounted in the holder 1532 form permanent components of the pump 1200, while the capping modules and substrate form relatively cheap, disposable components. In this manner, the components that are exposed to fluids, and capable of contamination may be disposed after a single use, while the actuator components, which are relatively expensive, can be used multiple times for different substrates and capping modules.

In the embodiments shown in FIGS. 13A, 13B and 14, all three capping modules 15a, 15b, 15c forming the pump 1200 are formed on the same surface of the substrate 11. One skilled in the art will recognize that the invention is not limited to the illustrative configuration. For example, the one or more of the capping modules may be stacked on a different surface of the substrate from the other capping modules forming the pump. The capping modules may be placed in any suitable location on the substrate such that a chamber formed in the capping module is placed in communication with communication ports of the substrate.

Figure 15:
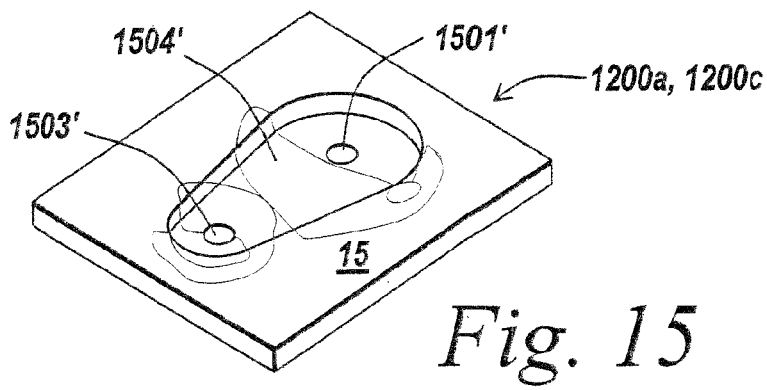
FIG. 15 is a perspective view of a capping module used to create the outlet valve of the pump of FIGS. 13A and 14 according to alternate embodiment of the invention.

FIG. 15 illustrates a capping module suitable for forming the valves 1200a or 1200c according to an alternative embodiment of the invention. As shown, the capping module can include a recess 1504' formed in a surface of the capping module 15' facing away from the substrate when the capping module is stacked on the substrate. In this embodiment, the capping module 15' includes channels 1501', 1503' extending from the recess to the opposite surface of the capping module configured to abut the substrate. When the capping module is stacked on the substrate, the channels are placed in communication with the ports on the substrate to provide fluid communication between the recess and the substrate channels. The membrane then covers the recess to form and seal the valve chamber.

As shown in FIGS. 13B-15, the chambers 1504a and 1504b forming the valves 1200a, 1200b may be tapered towards the outlet valve 1503a 1503b, respectively. The tapered shape of the chamber facilitates fluid flow through the valve chamber, and directs fluid flowing into the chamber 1504a or 1504b towards the outlet port 1503a or 1503b, respectively. One skilled in the art will recognize that the invention is not limited to the illustrated valve chamber configuration and that the chambers forming the valves and the pump chamber may have any suitable size, shape and configuration.

FIGS. 16A-16D illustrate the operation sequence of the illustrated pump 1200. As described, the inlet port 1501a of the inlet valve 1200b is connected, via an inlet channel 13a, to a reservoir 1600 containing a supply of fluid, such as a drug, to be pumped. The outlet port 1503b of the outlet valve 1200c is connected, via the outlet channel 13b to a receiver of the fluid, for example, the body 1700 of a patient. In a first step, the inlet valve 1200b is sealed to isolate the reservoir 1600 from the pump chamber 1201. According to the illustrative embodiment, the inlet valve 1200b is sealed by depressing the membrane 1530*b*, such that the membrane covers and seals the inlet port 1501*a* of the inlet valve. In the illustrative embodiment, an external actuator (not shown) selectively depresses the membrane to seal the inlet valve, though one skilled in the art will recognize that any suitable means may be used to selectively seal the inlet valve of the pump 1200.

Figure 16A:
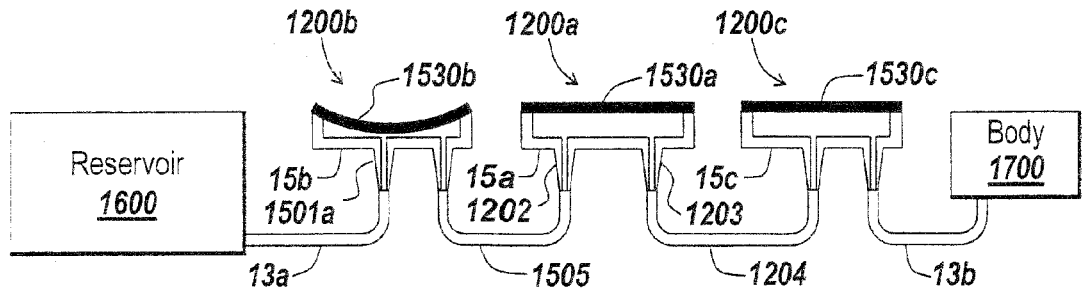
FIGS. 16A-16D illustrate the components of the pump of FIGS. 13A and 13B during each step of an operation sequence according to an illustrative embodiment of the invention.
Figure 16B:
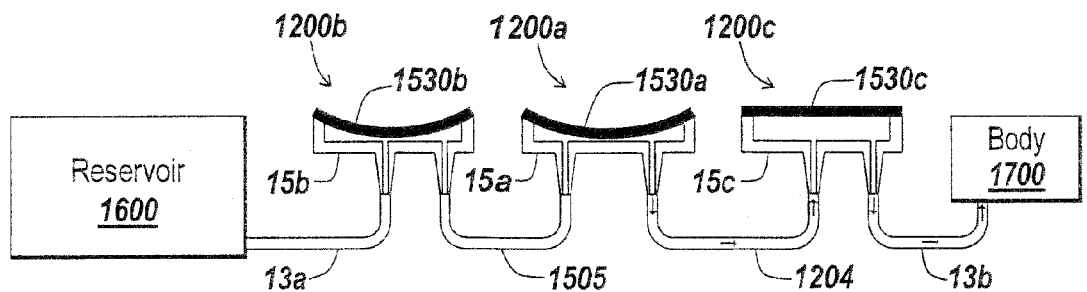

In a second step, shown in FIG. 16B, a pump chamber actuator, or other suitable mechanism, deflects the pump chamber membrane 1530*a* to exhaust fluid from the pump chamber 1201 through the outlet valve 1200*c*. As shown, in the second step, the membrane 1530*b* of the inlet valve 1200*b* remains in a deflected state to keep the inlet valve 1200*b* closed and sealed and prevent backflow of the fluid. The outlet valve 1200*c* is open to allow fluid from the pump chamber 1201 to freely flow therethrough. In an illustrative embodiment, the pump chamber exhausts a drug through the outlet valve to infuse a drug into the body 1700 of a patient.

Figure 16C:
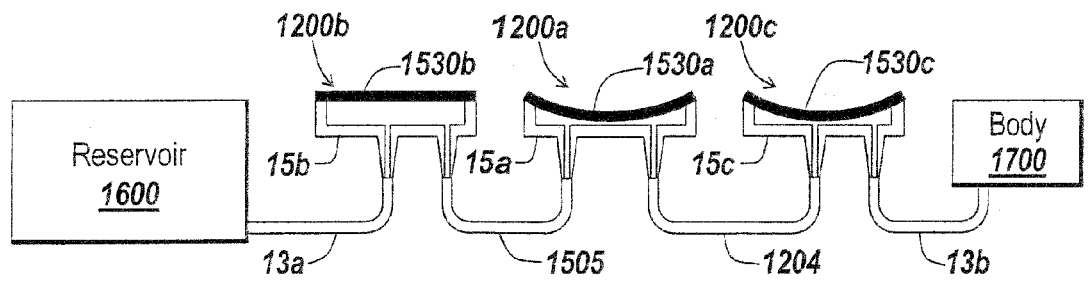
Figure 16D:
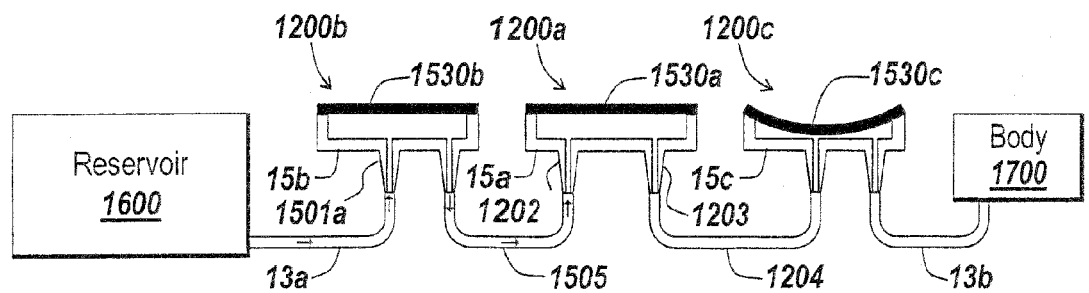

In a third step, shown in FIG. 16C, the outlet valve actuator 1531*c*, or other suitable mechanism, deflects the outlet valve membrane 1530*c* to block the inlet port 1501*b* of the outlet valve 1200*c*, thereby sealing the outlet valve 1200*c*. At the same time, the membrane 1530*b* of the inlet valve 1200*b* returns to a rest position, opening the inlet valve 1200*b* to allow fluid flow therethrough. During this step, the membrane 1530*a* of the pump chamber remains in a deflected state to prevent fluid flow through the pump chamber 1201.

In a fourth step, shown in FIG. 15D, the pump chamber membrane 1530*a* is released, causing the membrane to return to a rest position. As the membrane 1530*a* retracts, the pump chamber 1201 draws fluid from the reservoir 1600 into the pump chamber 1201 via the open inlet valve 1200*b*.

After the fourth step, the inlet valve 1200*b* may then be sealed to isolate the pump chamber 1201 from the reservoir 1600, as shown in FIG. 16A. The operation sequence illustrated in FIGS. 16A-16D repeats to continue pumping fluid from the reservoir to the body 1700 or other fluid receiving component.

The illustrated pump 1200 formed using capping modules stacked on a microfluidic substrate according to an illustrative embodiment of the invention has a relatively small, compact size, low cost, while providing accurate flows. The pump 1200 is capable of delivering fluids, such as drugs for infusion, at a flow rate of between about 0.1 ml/hour and about 900 ml/hour. Because the external actuators displace the membranes by a fixed amount, the pump 1200 can provide a fixed dispensed volume per cycle independent of fluid viscosity. The pump 1200 can then operate independently of the viscosity of the fluid being pumped. In addition, the use of permanent components for the actuators, which can be relatively expensive, and disposable, low-cost components for the fluid paths of the pump allows for a relatively low cost, compact design. The pump design can be readily modified according to the desired flow rates, the actuator force required, cost, volume, lifetime or other parameters.

One skilled in the art will recognize that the capping module is not limited to the illustrative embodiment and that other elements may be implemented to add other microfluidic functions, in addition to or in place of, filtration and flow control.

A microfluidic system compiled using a capping module according to an embodiment of the present invention advantageously combines the power and scope of conventional membrane technology with the small volume dynamic flow control inherent in microfabricated/microstructure microfluidic systems. The present invention provides cost effective mixing of any suitable polymer membrane with a microfluidic network. The microfiltration system is simple and inexpensive to add to a microfluidic system, as the incremental cost of assembling the microfiltration system in a microfluidic chip is relatively low above the cost of the microfluidic system itself A microfluidic system according to the present invention may comprise one or more of the above-described components, alone or in combination with other components.

The present invention has been described relative to an illustrative embodiment. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention, which, as a matter of language, might be said to fall therebetween.

The invention claimed is:

1. A method of delivering a fluid from a fluid source, comprising the steps of:
providing a pump comprising a microfluidic substrate having a first capping module stacked thereon to form a pump chamber, a second capping module stacked thereon to form an inlet fluid regulating device into the pump chamber and a third capping module stacked thereon to form an outlet fluid regulating device from the pump chamber, each capping module defining a chamber in communication with an inlet channel and an outlet channel formed in the microfluidic substrate and having a flexible membrane forming a side wall of the chamber to selectively block fluid flow through the chamber; and
an external actuator disposed adjacent to and in contact with the membrane of at least one of the capping modules selectively deflecting the membrane to pump fluid from the fluid source through the infusion pump.

2. The method of claim 1, wherein the step of selectively deflecting comprises the steps of:
deflecting the membrane of the inlet fluid regulating device to isolate the fluid source from the pump chamber; and
deflecting the membrane of the pump chamber to exhaust fluid from the pump chamber through the outlet fluid regulating device.

3. The method of claim 2, wherein the step of selectively deflecting further comprises the steps of:
deflecting the membrane of the outlet fluid regulating device to seal the outlet fluid regulating device, while opening the inlet fluid regulating device to allow fluid flow therethrough and maintaining the membrane of the pump chamber in a deflected state to prevent fluid flow through the pump chamber; and
releasing the membrane of the pump chamber, causing the pump chamber to draw fluid from the reservoir via the open inlet fluid regulating device.

4. The method of claim 2, wherein the membrane of the inlet fluid regulating device remains in a deflected state to keep the inlet fluid regulating device closed and sealed and prevent backflow of the fluid during the step of deflecting the membrane of the pump chamber.

* * * * *